United States Patent [19]

Doornhein et al.

[11] Patent Number: 5,046,051

[45] Date of Patent: Sep. 3, 1991

[54] SERIAL MEMORY WITH ADDRESS COUNTER WHICH CAN BE PRESET USING A MULTI-PURPOSE INPUT, AND PICTURE MEMORY APPARATUS USING SAME

[75] Inventors: Laurens Doornhein; Jeroen Kettenis, both of Eindhoven, Netherlands

[73] Assignee: U.S. Philips Corporation, New York, N.Y.

[21] Appl. No.: 269,229

[22] Filed: Nov. 9, 1988

[30] Foreign Application Priority Data

Nov. 9, 1987 [NL] Netherlands ............... 8702672

[51] Int. Cl.$^5$ ................... G11C 5/06; G11C 8/00
[52] U.S. Cl. ................... 365/221; 365/233; 365/236; 365/239; 365/78
[58] Field of Search ............ 365/238, 240, 78, 221, 365/236, 239, 219

[56] References Cited

U.S. PATENT DOCUMENTS 4,159,541  6/1979  Ward et al. ............... 365/233
4,751,675  6/1988  Knauer ............... 365/78 X
4,813,015  3/1989  Spak et al. ............... 365/240

FOREIGN PATENT DOCUMENTS 0211385  2/1987  European Pat. Off. .
WO7900912  11/1979  PCT Int'l Appl. .

OTHER PUBLICATIONS

Signetics 74164, 7485, Data Handbook Electronic Components & Materials-Philips-, pp. 5/125-131, 5/284-294, 5/295-299, Dec. 85.

Primary Examiner—Stuart N. Hecker
Assistant Examiner—Alfonso Garcia
Attorney, Agent, or Firm—Michael E. Marion

[57] ABSTRACT

A serial memory in which serial address input devices share a terminal with control signal input devices is suitable for the non-shifting storage of information and includes at least one address counter which receives address incrementation signals from a clock and which is suitable for receiving a preset address on the serial address input means.

26 Claims, 3 Drawing Sheets

SERIAL MEMORY WITH ADDRESS COUNTER WHICH CAN BE PRESET USING A MULTI-PURPOSE INPUT, AND PICTURE MEMORY APPARATUS USING SAME

BACKGROUND OF THE INVENTION

The invention relates to a serial memory, comprising a series of memory cells, data input means, data output means, control signal input means, clock signal input means and serial address input means sharing a particular terminal with said control signal input means.

A memory of this kind is known from U.S. Pat. No. 4,159,541.

The memory described therein has only four terminals; this appears to be an absolute minimum, but such a small number reduces the flexibility; for example, all input and output data, in addition to address signals and mode-control signals, must pass through a single terminal. Furthermore, the known memory uses CCD-technology which is energy-inefficient.

SUMMARY OF THE INVENTION

It is an object of the invention to provide a serial memory comprising a clock-incremented address counter and having low dissipation as well as easy accessibility.

To achieve this, the serial memory in accordance with the invention is characterized in that the memory is suitable for the non-shifting storage of information and furthermore comprises at least one address counter suitable for accepting, under the control of an activation signal received on said control signal input means, a preset address received on said serial address input means, said at least one address counter receiving address incrementation signals from said clock signal input means.

FURTHER ASPECTS OF THE INVENTION

A first embodiment of the serial memory is constructed so that it comprises a read address counter as well as a write address counter, each counter being selectively loadable by connection to respective associated serial address input means. This offers greater flexibility.

In a further embodiment, the serial memory is constructed so that a reset input is used as the serial address input means. This offers the advantage of easy implementation.

In another embodiment the serial memory is constructed so that is comprises recognition elements for header information which precedes the preset address and is receivable on the serial address input means, which header information uniquely identifies the beginning of a subsequent preset address, and/or for termination information which succeeds the preset address and which can be received on the serial address input means, which termination information uniquely identifies the end of a preceding preset address. This facilitates the detection of the preset address.

A further embodiment of the serial memory is constructed so that said recognition elements comprise an output via which, after detection of a given pattern in said header information, a signal is supplied which ensures that the normal function of said input means, used as the serial address input means and also usable for another signal, is cancelled until the inspection of said preset address has been complete. This simplifies the input of the preset address.

The invention also relates to a picture memory device comprising one or more of the described embodiments of serial memories, and a reproduction apparatus comprising a reproduction element and a picture memory device, of the kind set forth.

The facility for supplying a preset address can be used in video signal processing, for example for "picture in picture" and "zoom".

BRIEF DESCRIPTION OF THE FIGURES

The invention will be described in detail hereinafter with reference to some Figures.

DESCRIPTION OF A PREFERRED EMBODIMENT

Figure 1:
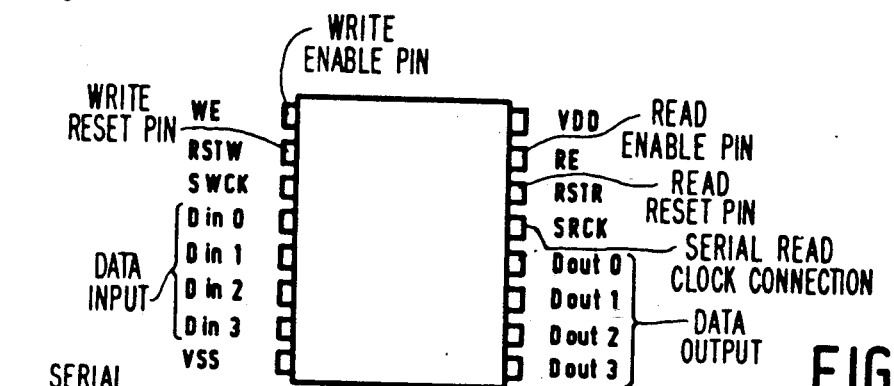
FIG. 1 shows the interface of a known serial memory module for 256K × 4 bits.

FIG. 1 shows the interface of a memory module comprising separate connections for read and write operations.

There are provided 4 inputs for data (Din0–Din3); 4 outputs for data (Dout0–Dout3); 2 connections for power supply (VDD, VSS); a write enable pin and a read enable pin (WE, RE) for (de-) activating write and read operations, respectively; a serial write clock connection and a serial read clock connection (SWCK, SRCK) for synchronization; a write reset pin and a read reset pin (RSTW, RSTR) for resetting the write address and the read address to zero, respectively, so 16 pins in total.

In the present embodiment the reset inputs for reading and writing are used as the serial address input means for inputting the preset address with the header information and termination information.

Figure 2:
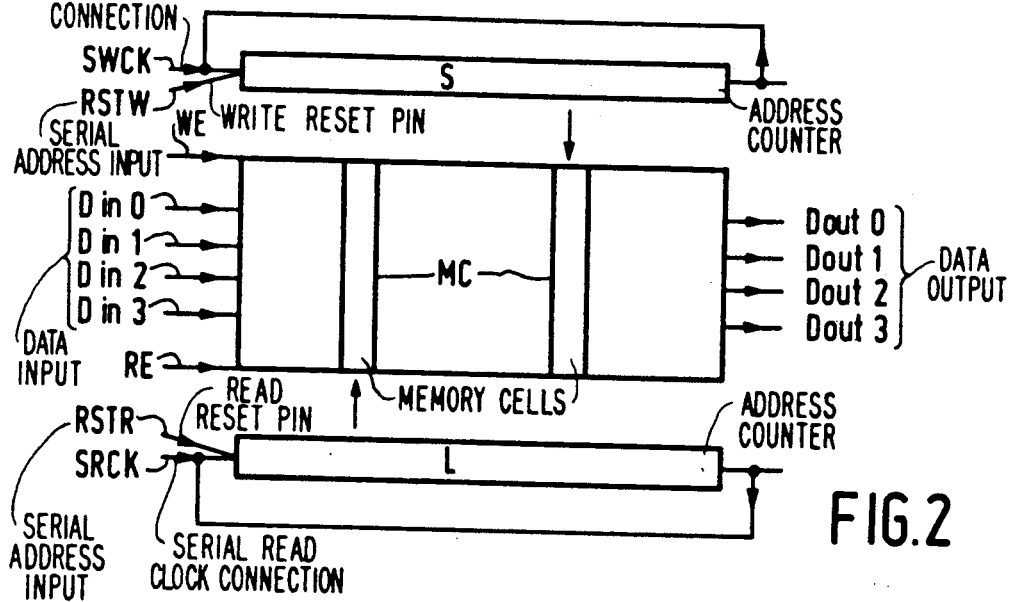
FIG. 2 shows a circuit diagram of the preset mechanism.

FIG. 2 shows the circuit diagram of the preset mechanism. Via the serial address input means (in this case one of the reset inputs) the preset address enters the associated address counter S or L which addresses, in combination with a decoder, a given memory cell MC and which subsequently counts further starting from the preset address. The terms used are the same as those used in FIG. 1.

Figure 3A:
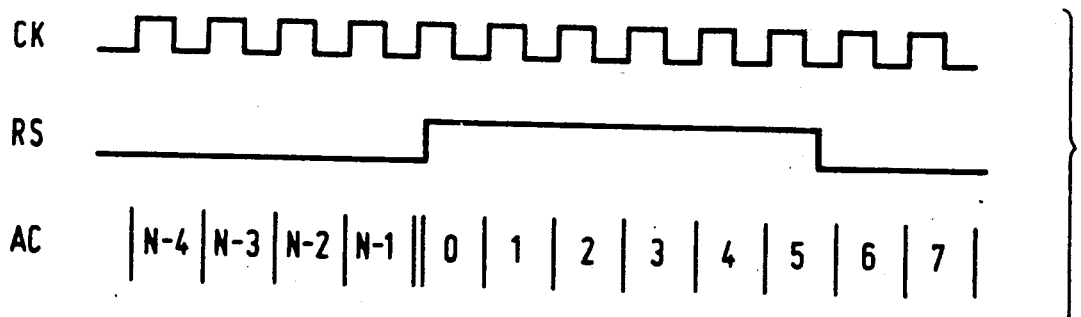
FIGS. 3A and 3B shows a timing diagram for a preferred embodiment with a header and a termination information pattern.

FIG. 3A shows a timing diagram for a normal reset operation. Resetting is asynchronous in this case: in response to the transition from 0 to 1 of the reset signal RS, the address counter AC (for reading or writing) is reset to the address 0. The address counter counts further in the rhythm of the clock signal CK (for reading or writing). The increment of the address counter is chosen to be 1 in the present case, but may also have any other arbitrary value (also a negative value) which is not equal to 0. It will be apparent also that resetting need not necessarily take place to the address 0, and that any other fixed address is also feasible.

Figure 3B:
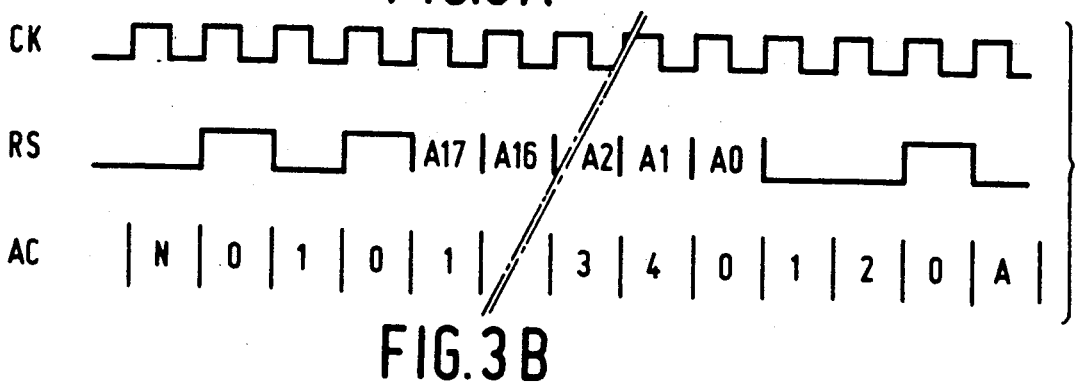

FIG. 3B shows a timing diagram for a reset instruction in a preferred embodiment in which the reset input is used as the serial address input means for the input of a preset address with preceding header information and subsequent termination information. The reset signal RS is synchronized with the clock signal CK. The preset address A consists of 18 bits; the header information and the termination information consist of 3 bits each. Evidently other numbers are also possible. The address counter value becomes 0 each time a 1 bit succeeds a 0 bit between the beginning of the header information and the end of the termination information. After the preset address with the header information and the termination information has been written into a shift register (see FIG. 4), recognition elements compare this header information and termination information with a given fixed pattern, for example 101 and 001; when correspondence is detected the preset address A between the header information and the termination information is input into the address counter: the address counter value becomes A.

Between two successive reset instructions to a preset address the reset signal must remain stable for some clock signals (depending on the header and termination patterns chosen) in order to prevent interference.

The normal reset function where the address counter is reset to the starting address of the memory can be maintained.

Other versions where only header information or only termination information is used operate analogously.

Another embodiment utilizes header information and/or termination information which ensures, after recognition by recognition elements, that a signal is supplied which ensures that the normal reset function of the reset input is cancelled for the number of clock signals corresponding to the length of the preset address. After this time interval, the preset address is introduced into the address counter and the normal reset function of the reset input is restored.

It will be apparent that instead of the reset input another signal input can be used as the serial address input means, for example an enable input or a data input.

Figure 4:
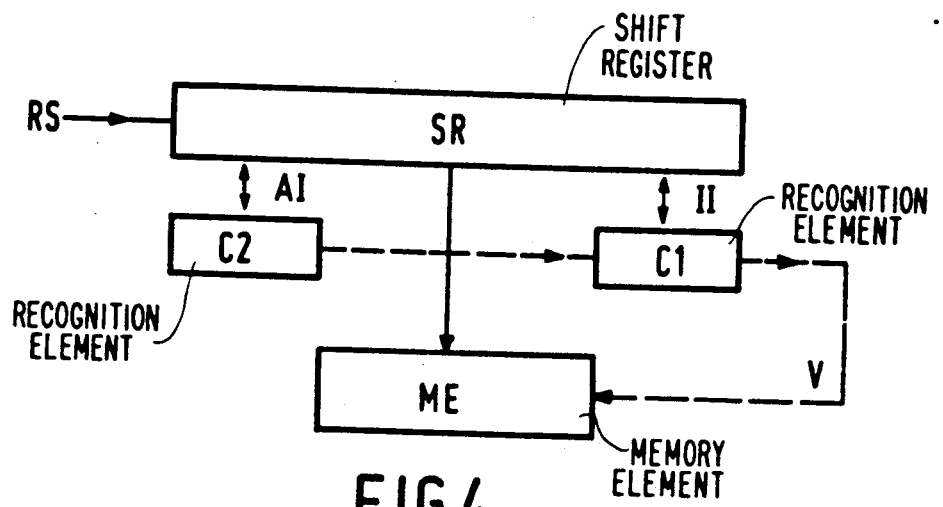
FIG. 4 shows a diagram of hardware suitable for the preset mechanism.

FIG. 4 shows a diagram or hardware which is suitable for the preset mechanism: a shift register SR for writing the preset address V with the header information and termination information, II and AI, respectively, and recognition elements C1 and C2 for the header information and the termination information. When correspondence with a fixed pattern is detected, the remainder of the contents of the shift register, being the preset address V, is stored in the memory element ME of the address counter.

Figure 5:
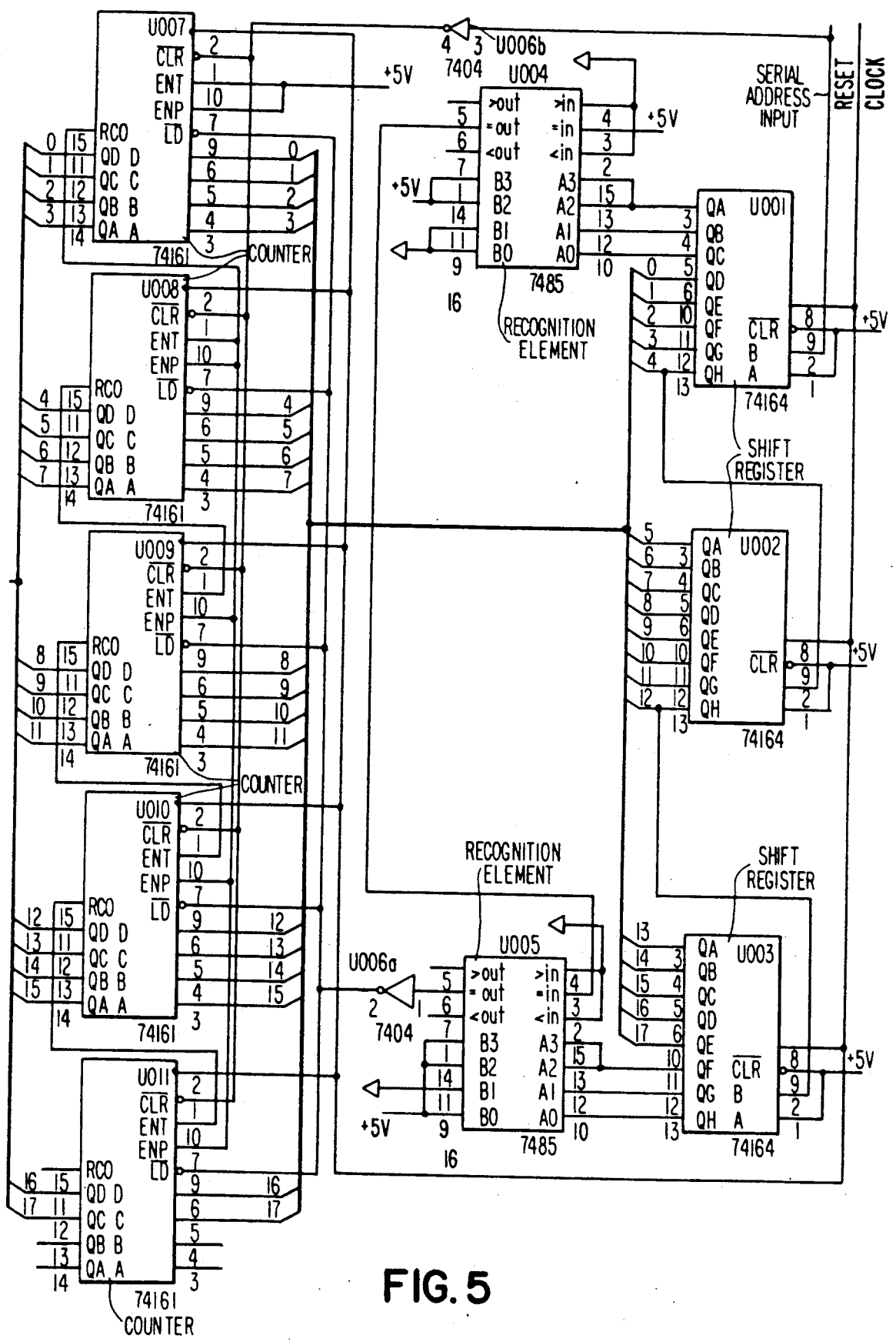
FIG. 5 is a breadboard representation of the reset mechanism.

FIG. 5 is a breadboard representation of the reset mechanism. The blocks U001, U002 and U003 (Signetics 74164; see Philips Data Handbook Electronic Components and Materials, Integrated Circuits Book ICO9N, 1986, TTL Logic Series Signetics) form the shift register in which the preset address with the header and termination information is stored. The blocks U004 and U005 are recognition elements (Signetics 7485 comparators) which compare the termination information and the header information with a given pattern. When correspondence is detected, the memories of counters U007 and U011 (Signetics 74161) are loaded with the preset address. The blocks U006a and U006b are inverters (Signetics 7404).

U001, U002, U003, and U007–U011 are connected to a clock signal. The input $\overline{CLR}$ of U007–U011 and the input B of U001 are connected to a reset signal. The input $\overline{CLR}$ of U001–U003 is always high; input A is not used. In the case of a reset instruction, the preset address with the header information and the termination information is input in U001–U003 via the input B and the output QH.

The recognition element U004 checks the correspondence (input No. 3 is high; Nos. 2 and 4 are low) of the termination information (QC, QB and QA in U001) with pattern "001" (B0, B1, B2=B3). Output No. 6 is connected to input No. 3 of U005. This recognition element performs the same operation on the header information. If this information also corresponds to the predetermined pattern (in this case "101" in B0, B1, B2=B3), the inputs LD of U007–U011 receive a signal and the preset address (the central 18 outputs of U001–U003, numbered 0-17) is loaded via the inputs A, B, C, D of U007–U010 and C, D of U011.

Inputs ENT and ENP of U007 are high, output RCO of U007 is connected to ENT of U008 and ENP of U008–U011, RCO of U008 is connected to ENT of U009, and so for the other counter 1 memory elements. The 18 outputs QA, QB, QC, QD of U007–U010 and QC, QD of U011, containing the preset address, are connected to an internal memory address bus.

Figure 6A:
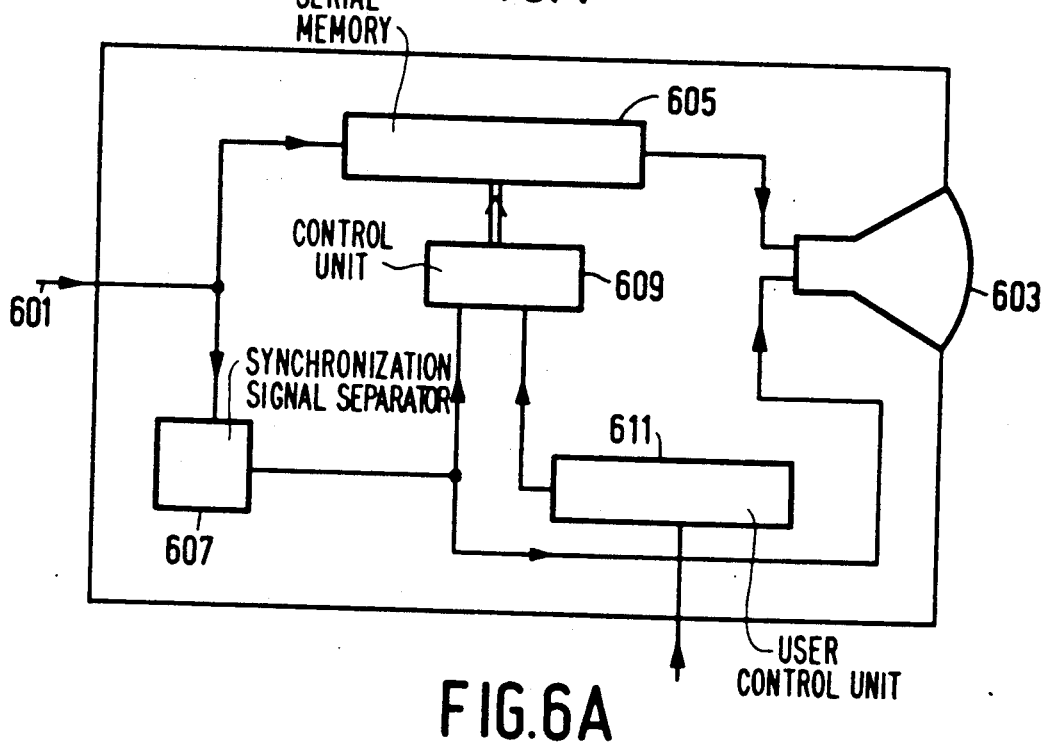
FIGS. 6A and 6B shows a reproduction apparatus comprising a picture memory device.

FIG. 6A shows the circuit diagram of an embodiment of a reproduction apparatus comprising a picture memory device. Input data line 601 is connected to serial memory 605 and to synchronization signal separator 607. The latter is connected to control unit 609 and the reproduction element 603. The control unit controls the serial memory, and the user control unit 611 feeds the control unit. The coupling and matching means are not described for the sake of simplicity.

Figure 6B:
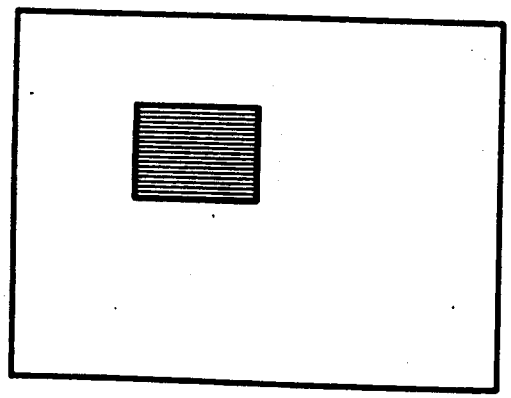

FIG. 6B shows an application of preset addresses in the case of "picture in picture". Without preset addresses, the picture memory is each time completely addresses. Thanks to the improved accessibility offered by the use of preset addresses, part of the picture memory can be separately addressed without influencing the other contents. The whole operation is realized without additional connections.

What is claimed is:

1. A serial memory, comprising a series of memory cells, data input means, data output means, control signal input means, clock signal input means and serial address input means sharing a particular terminal with said control signal input means, characterized in that the memory is suitable for the non-shifting storage of information and furthermore comprises at least one address counter suitable for accepting, under the control of an activation signal provided by said control signal input means, a preset address accompanied by at least one of header information identifying a beginning of said preset address and termination information identifying an end of said preset address provided by said serial address input means, said at least one address counter receiving address incrementation signals from said clock signal input means.

2. A serial memory as claimed in claim 1 wherein said serial address means comprises a plurality of serial address inputs, and said memory further comprises a read address counter and a write address counter, each coupled to a respective serial address input.

3. A serial memory as claimed in claim 2, characterized in that a reset input is used as a serial address input.

4. A serial memory as claimed in claim 2, characterized in that it comprises recognition elements for header information which is preceding the preset address and is receivable on a serial address input, which header information uniquely identifies the beginning of a subsequent preset address.

5. A serial memory as claimed in claim 2, characterized in that it comprises recognition elements for termination information which succeeds the preset address and is receivable on a serial address input, which termination information uniquely identifies the end of a preceding preset address.

6. A picture memory device comprising at least one serial memories as claimed in claim 2.

7. A reproduction apparatus comprising a picture memory device as claimed in claim 6 and also comprising a reproduction element.

8. A serial memory as claimed in claim 2, characterized in that it comprises recognition elements for header information which precedes the preset address and termination information which succeeds the preset address, said information being both receivable on a serial address input, said header information and termination information together uniquely identifying the beginning and the end of a preset address, situated therebetween.

9. A serial memory as claimed in claim 1, characterized in that a reset input is used as the serial address input means.

10. A picture memory device comprising at least one serial memories as claimed in claim 9.

11. A reproduction apparatus comprising a picture memory device as claimed in claim 10 and also comprising a reproduction element.

12. A serial memory as claimed in claim 1, characterized in that it comprises recognition elements for header information which is preceding the preset address and is receivable on the serial address input means, which header information uniquely identifies the beginning of a subsequent preset address.

13. A serial memory as claimed in claim 12, characterized in that said recognition elements comprise an output via which, after detection of a given pattern in said header information by said recognition elements, a signal is supplied which disables the function of said control input means until the inspection of said preset address has been completed.

14. A picture memory device comprising at least one serial memories as claimed in claim 13.

15. A reproduction apparatus comprising a picture memory device as claimed in claim 14 and also comprising a reproduction element.

16. A picture memory device comprising at least one serial memories as claimed in claim 12.

17. A reproduction apparatus comprising a picture memory device as claimed in claim 16 and also comprising a reproduction element.

18. A serial memory as claimed in claim 1, characterized in that it comprises recognition elements for termination information which succeeds the preset address and is receivable on the serial address input means, which termination information uniquely identifies the end of a preceding preset address.

19. A picture memory device comprising at least one serial memories as claimed in claim 18.

20. A reproduction apparatus comprising a picture memory device as claimed in claim 19 and also comprising a reproduction element.

21. A serial memory as claimed in claim 1, characterized in that it comprises recognition elements for header information which precedes the preset address and termination information which succeeds the preset address, said information being both receivable on the serial address input means, said header information and termination information together uniquely identifying the beginning and the end of a preset.

22. A serial memory as claimed in claim 2, characterized in that said recognition elements comprise an output via which, after detection of a given pattern in said header information by said recognition elements, a signal is supplied which disables the function of said control input means until the inspection of said preset address has been completed.

23. A picture memory device comprising at least one serial memories as claimed in claim 21.

24. A reproduction apparatus comprising a picture memory device as claimed in claim 23 and also comprising a reproduction element.

25. A picture memory device comprising at least one serial memories as claimed in claim 1.

26. A reproduction apparatus comprising a picture memory device as claimed in claim 8 and also comprising a reproduction element.

* * * * *